(12) United States Patent
Ozeki et al.

(10) Patent No.: US 10,330,852 B2
(45) Date of Patent: Jun. 25, 2019

(54) LIGHT-EMITTING DEVICE

(71) Applicant: NICHIA CORPORATION, Anan-shi, Tokushima (JP)

(72) Inventors: Kenji Ozeki, Tokushima (JP); Akira Goto, Tokushima (JP)

(73) Assignee: NICHIA CORPORATION, Anan-shi (JP)

( * ) Notice: Subject to any disclaimer, the term of this patent is extended or adjusted under 35 U.S.C. 154(b) by 0 days.

(21) Appl. No.: 15/783,354

(22) Filed: Oct. 13, 2017

(65) Prior Publication Data

US 2018/0106942 A1    Apr. 19, 2018

(30) Foreign Application Priority Data

Oct. 19, 2016  (JP) ................................ 2016-205514
May 31, 2017  (JP) ................................ 2017-107783

(51) Int. Cl.
   *F21V 21/03*    (2006.01)
   *F21V 8/00*     (2006.01)
   (Continued)

(52) U.S. Cl.
   CPC ............. *G02B 6/005* (2013.01); *G02B 6/002* (2013.01); *G02B 6/0018* (2013.01);
   (Continued)

(58) Field of Classification Search
   CPC ...... G02B 6/005; G02B 6/0018; G02B 6/002; G02B 6/0065; G02B 6/0068
   (Continued)

(56) References Cited

U.S. PATENT DOCUMENTS 8,568,012 B2 * 10/2013 Park ..................... G02B 6/0023
                                                 362/612
2015/0021642 A1    1/2015 Nakabayashi
                   (Continued)

FOREIGN PATENT DOCUMENTS

JP    2010-219324 A    9/2010
JP    2010-283281 A    12/2010
                  (Continued)

*Primary Examiner* — Karl D Frech
(74) *Attorney, Agent, or Firm* — Global IP Counselors, LLP

(57) ABSTRACT

A light-emitting device includes a light-emitting element, first and second light-transmissive members disposed on the light-emitting element, a light-guiding member, and a light-reflective member. A perimeter of a lower surface of the first light-transmissive member is disposed inwardly of a perimeter of an upper surface of the light-emitting element in a plan view. The light-guiding member covers the upper surface of the light-emitting element and the lower surface and lateral surfaces of the first light-transmissive member. The light-guiding member does not cover an upper surface of the second light-transmissive member and at least a portion of a lateral surface of the second light-transmissive member continuous. The light-reflective member covers lateral surfaces of the light-guiding member and at least the portion of the lateral surface of the second light-transmissive member exposed from the light-guiding member. The light-reflective member does not cover the upper surface of the second light-transmissive member.

17 Claims, 10 Drawing Sheets

(51) Int. Cl.
*H01L 33/00* (2010.01)
*H01L 33/50* (2010.01)

(52) U.S. Cl.
CPC ......... *G02B 6/0065* (2013.01); *G02B 6/0068* (2013.01); *H01L 33/00* (2013.01); *H01L 33/50* (2013.01)

(58) Field of Classification Search
USPC ........................................................ 362/606
See application file for complete search history.

(56) References Cited

U.S. PATENT DOCUMENTS

| | | |
|---|---|---|
| 2015/0207045 A1 | 7/2015 | Wada et al. |
| 2015/0255437 A1 | 9/2015 | Moosburger |
| 2015/0263254 A1 | 9/2015 | Miyoshi et al. |
| 2017/0236981 A1 | 8/2017 | Nakabayashi |

FOREIGN PATENT DOCUMENTS

| | | |
|---|---|---|
| JP | 2013-110199 A | 6/2013 |
| JP | 2013-168685 A | 8/2013 |
| JP | 2014-120722 A | 6/2014 |
| JP | 2015-023162 A | 2/2015 |
| JP | 2015-038963 A | 2/2015 |
| JP | 2015-138838 A | 7/2015 |
| JP | 2015-188069 A | 10/2015 |
| JP | 2015-530754 A | 10/2015 |

\* cited by examiner

LIGHT-EMITTING DEVICE

CROSS REFERENCE TO RELATED APPLICATIONS

This application claims priority to Japanese Patent Application No. 2016-205514 filed on Oct. 19, 2016, and Japanese Patent Application No. 2017-107783 filed on May 31, 2017. The entire disclosures of Japanese Patent Application No. 2016-205514 and Japanese Patent Application No. 2017-107783 are hereby incorporated herein by reference.

BACKGROUND OF THE INVENTION

1. Field of the Invention

The present invention relates to a light-emitting device.

2. Description of Related Art

Light-emitting devices including light-emitting elements are often used for light sources for headlights of vehicles and backlights for liquid-crystal displays, etc. As one example of such light emitting devices, a light-emitting device includes a substrate, an LED element mounted on an upper surface of the substrate, a phosphor plate that is disposed on an upper surface of the LED element and having an area smaller than an area of the LED element in a top view, and a white resin covering lateral surfaces of the LED element and lateral surfaces of the phosphor plate (see Japanese Unexamined Patent Application Publication No. 2013-110199). The light-emitting device having such a structure is configured to emit, to the outside, light in which light emitted from the light-emitting element and a part of the light emitted from the light-emitting element wavelength-converted by a phosphor are mixed.

In the above-mentioned light-emitting device, in a top view, the phosphor plate has an area smaller than the upper surface of the light-emitting element, so that light is irradiated upward in a smaller region.

In the light-emitting device proposed in Japanese Unexamined Patent Application Publication No. 2013-110199, in order to allow light emitted from a portion of the light-emitting surface of the light-emitting element exposed from the phosphor plate to be incident on the phosphor plate, the phosphor plate is bonded to the light emitting element using a light-transmissive bonding member, and the bonding member has inclined surfaces at the lateral surfaces of the phosphor plate.

However, with the phosphor plate having an area smaller than an area of the upper surface of the light-emitting element in a top view, if the bonding member bonding the light-emitting element to the phosphor plate covers the entire outer lateral surfaces of the phosphor plate, light emitted from the light-emitting element and travels through the bonding member may leak out from the light-emitting device without entering the phosphor plate. If the light leaked through the bonding member covering the outer lateral surfaces of the phosphor plate is noticeable against the mixed light emitted from the upper surface of the phosphor plate, the resulting emission color may be uneven.

Certain embodiments of the present invention has an object to provide a high-luminance light-emitting device in which unevenness in emission color is reduce.

SUMMARY OF THE INVENTION

A light-emitting device according to an aspect of the present disclosure includes a light-emitting element, a first light-transmissive member, a second light-transmissive member, a light-guiding member, and a light-reflective member. The light-emitting element has an upper surface serving as a light-extracting surface of the light emitting element. The first light-transmissive member contains a phosphor and is disposed on the upper surface of the light-emitting element. The first light-transmissive member has an upper surface and a lower surface. At least a portion of a perimeter of the lower surface of the first light-transmissive member is disposed inwardly of a perimeter of the upper surface of the light-emitting element in a plan view. The second light-transmissive member has an upper surface and a lower surface with the lower surface of the second light-transmissive member being bonded to the upper surface of the first light-transmissive member. A perimeter of the lower surface of the second light-transmissive member coincides with or disposed inwardly of a perimeter of the upper surface of the first light-transmissive member in the plan view. The light-guiding member covers the upper surface of the light-emitting element and the lower surface and lateral surfaces of the first light-transmissive member. The light-guiding member does not cover an upper surface of the second light-transmissive member and at least a portion of each of lateral surfaces of the second light-transmissive member continuous with the upper surface of the second light-transmissive member. The light-reflective member covers at least the portion of each of the lateral surfaces of the second light-transmissive member exposed from the light-guiding member and lateral surfaces of the light-guiding member. The light-reflective member does not cover the upper surface of the second light-transmissive member.

According to certain embodiments of the present invention, a high-luminance light-emitting device of which unevenness in emission color is reduced.

DETAILED DESCRIPTION OF EMBODIMENTS

Figure 1A:
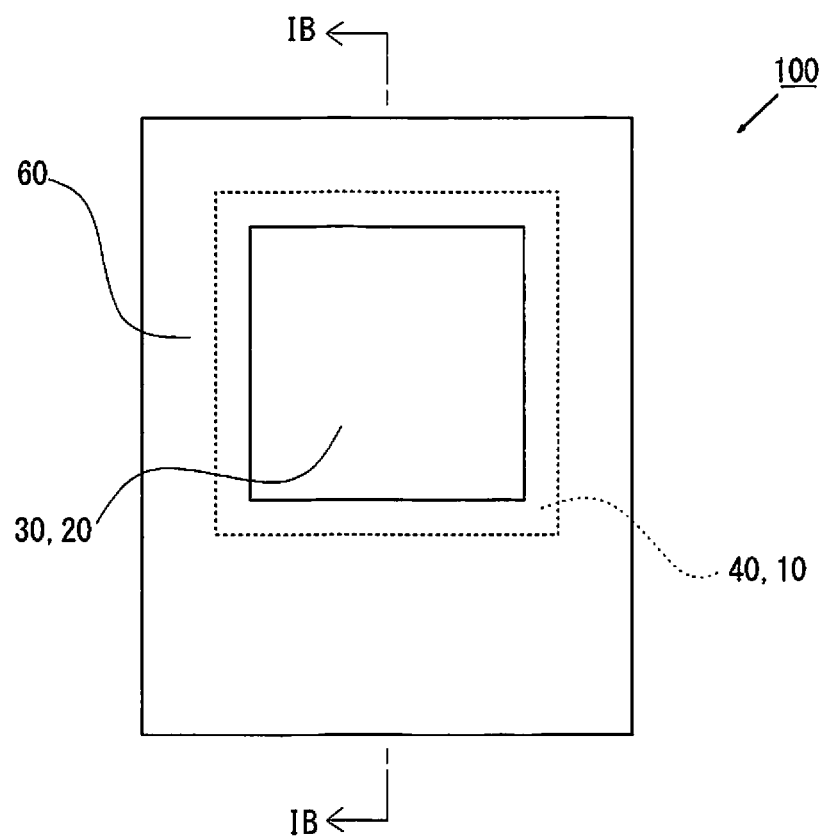
FIG. 1A is a schematic plan view of a light-emitting device according to a first embodiment of the present invention.

In the present application, size or positional relationship of members illustrated in each drawing may be exaggerated in order to clarify the descriptions. In the descriptions below, the same term or reference numeral represents the same member or a member made of the same material, and its detailed description may be omitted as appropriate. Constitutions described in one example or one embodiment are applicable to other examples and embodiments.

First Embodiment

Figure 1B:
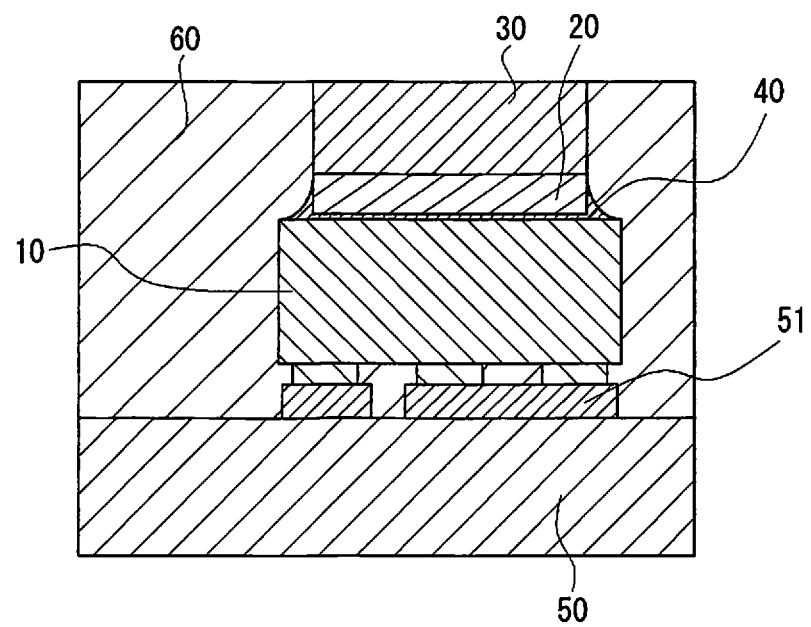
FIG. 1B is a schematic cross-sectional view taken along the line IB-IB in FIG. 1A.
Figure 1C:
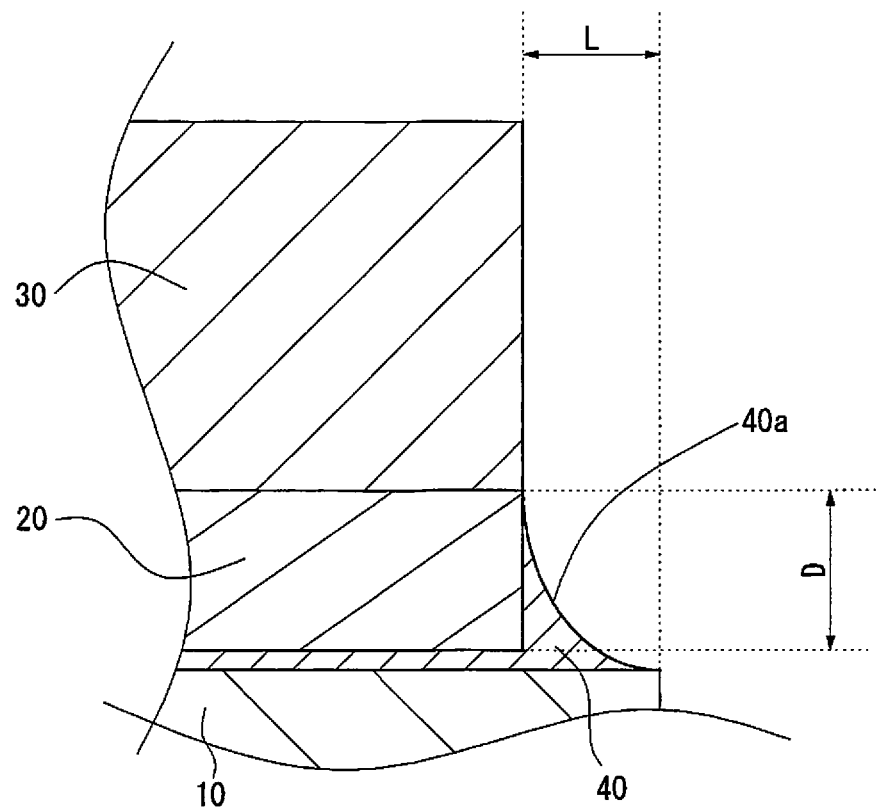
FIG. 1C is an enlarged schematic cross-sectional view of a portion of the light-emitting device in the first embodiment in the vicinity of a lateral surface of a first light-transmissive member.

As shown in FIGS. 1A to 1C, a light-emitting device 100 according to a first embodiment of the present invention includes a light-emitting element 10 having an upper surface that serves as a light-extracting surface of the light emitting element 10; a first light-transmissive member 20 disposed on the upper surface of the light-emitting element 10, having a lower-surface with a perimeter disposed inwardly of a perimeter of the upper surface of the light-emitting element 10 in a plan view, and containing a phosphor; a second light-transmissive member 30 bonded to an upper surface of the first light-transmissive member 20 and having a lower surface with a perimeter substantially coinciding with a perimeter of an upper surface of the first light-transmissive member 20 in the plan view; a light-guiding member 40 covering the upper surface of the light-emitting element 10 and the lower surface and lateral surfaces of the first light-transmissive member 20 while the light-guiding member 40 does not cover an upper surface of the second light-transmissive member 30 and at least a portion of each of the lateral surfaces of the second light-transmissive member 30 continuous with the upper surface thereof; and a light-reflective member 60 covering lateral surfaces of the light-guiding member 40 and at least the portion of each of the lateral surfaces of the second light-transmissive member 30 exposed from the light-guiding member 40 while the light-reflective member 60 does not cover the upper surface of the second light-transmissive member 30.

In the light-emitting device 100 according to the present embodiment, the first light-transmissive member 20 and the second light-transmissive member 30 are integrally formed. For example, the first light-transmissive member 20 is a resin layer containing a phosphor, and the second light-transmissive member 30 is a glass plate serving as a member supporting the first light-transmissive member 20. With this arrangement, the first light-transmissive member 20 containing a phosphor at a high concentration and having a small thickness can be formed on the second light-transmissive member 30.

Further, in the light-emitting device 100 according to the present embodiment, the light-guiding member 40 has lateral surfaces 40a that broaden from an upper surface side of the first light-transmissive member 20 toward a lower surface side of the first light-transmissive member 20. The light-guiding member 40 has curved surfaces that are concave or convex toward a light-reflective member 60 side, and the light-guiding member 40 is in contact with both the lateral surfaces of the first light-transmissive member 20 and the upper surface of the light-emitting element 10. Such a shape of the light-guiding member 40 allows the outer surfaces of the light-guiding member 40 to be appropriate reflection surfaces, and enables light emitted from the light-emitting element 10 to be reflected and guided to the first light-transmissive member side.

The following describes each member in detail.

Light-Emitting Element 10

A semiconductor light-emitting element such as a light-emitting diode can be used as the light-emitting element 10. The light-emitting element 10 may have any appropriate emission wavelength. The light-emitting element 10 can include a light-transmissive substrate, a semiconductor layered body on the light-transmissive substrate, and positive and negative electrodes on a surface of the semiconductor layered body. One or more light-emitting elements 10 are mounted in a single light-emitting device. The light-emitting element 10 may be a light-emitting element in which a single semiconductor layered body is disposed on a single light-transmissive substrate, or a light-emitting element in which a plurality of semiconductor layered bodies is disposed on a single light-transmissive substrate.

In the semiconductor layered body in the light-emitting element 10, a plurality of semiconductor layers are layered. For example, the semiconductor layered body can include three semiconductor layers: a first conductive semiconductor layer (such as an n-type semiconductor layer), a light-emitting layer (active layer), and a second conductive semiconductor layer (such as a p-type semiconductor layer). A semiconductor layers that can emit ultraviolet light or visible light in the blue to green range can be made of, for example, a semiconductor material such as group III-V compound semiconductors or group II-VI compound semiconductors. More specifically, a nitride semiconductor material such as $In_XAl_YGa_{1-X-Y}N$ ($0 \leq X$, $0 \leq Y$, $X+Y \leq 1$) can be used.

In the case of using the above-mentioned nitride semiconductor material, for example, a light-transmissive insulating material such as sapphire ($Al_2O_3$) or spinel ($MgAl_2O_4$) or a semiconductor material (for example, a nitride semiconductor material) that transmits light emitted from the semiconductor layered body can be used for the light-transmissive substrate of the light-emitting element 10. The term "light-transmissive" in the present specification refers to having a transmittance of at least 60% or more, preferably approximately 80% or more, of light emitted from the light-emitting element.

The electrodes of the light-emitting element 10 are disposed on the same surface side of the semiconductor layered body (more specifically, a surface of the semiconductor layered body opposite to a light-transmissive substrate side). In the light-emitting element 10, a surface on which the plurality of electrodes are disposed serves as the lower surface, and the upper surface, which is a surface opposite to the lower surface (that is, a surface of the light-transmissive substrate), serves as a main light-extracting surface.

Each of the plurality of electrodes may have a single-layer structure or a layered structure as long as the electrodes have ohmic contact, which allows current-voltage characteristics to be linear or substantially linear, with respective one of the above-described first and second conductive semiconductor layers. Such electrodes can be made of a material and may have structure known in the field of the invention with any appropriate thickness. Metals such as Cu, Au, Ag, and AuSn are preferably used for the electrodes.

First Light-Transmissive Member 20

The first light-transmissive member 20 is disposed on the upper surface of the light-emitting element 10 via the light-guiding member 40 described below disposed therebetween. The lower surface of the first light-transmissive member 20 has an area smaller than an area of the upper surface of the light-emitting element 10, and the perimeter of the lower-surface of the first light-transmissive member 20 is disposed inwardly of the perimeter of the upper-surface of the light-emitting element 10 in a plan view. The first light-transmissive member 20 is bonded to the upper surface of the light-emitting element 10 via the light-guiding member 40 described below, and light emitted from the light-emitting element 10 enters the first light-transmissive member 20 through the light-guiding member 40. The light emitted from the light-emitting element 10 is narrowed down through the light-guiding member 40 before entering the first light-transmissive member 20.

The first light-transmissive member 20 has the upper surface, the lower surface opposite to the upper surface, and lateral surfaces between the upper surface and the lower surface. The lower surface of the first light-transmissive member 20 covers the light-extracting surface of the light-emitting element 10. It is preferable that the upper and lower surfaces of the first light-transmissive member 20 are each substantially flat and are substantially parallel to each other. In the present specification, the expression "substantially parallel" refers to that two surfaces are parallel to each other or one surface is inclined with respect to another surface with an inclination angle within approximately ±5 degrees.

The first light-transmissive member 20 contains a phosphor that can convert the wavelengths of at least a portion of light emitted from the light-emitting element 10. With the first light-transmissive member 20 containing the phosphor, light emitted from the upper surface of the first light-transmissive member 20 has a mixed color of light emitted from the light-emitting element 10 and light whose wavelength is converted from at least a portion of the light emitted from the light-emitting element 10 by the phosphor. Accordingly, white light can be obtained by, for example, mixing blue light emitted from the light-emitting element 10 and yellow light that is wavelength-converted from a portion of the blue light by the phosphor.

The first light-transmissive member 20 obtained by, for example, mixing the phosphor and a light-transmissive material such as resins, glass, or inorganic substances, which serves as a binder for a phosphor, and performing molding can be used. Among these materials, the first light-transmissive member 20 preferably contains a resin material. Examples of the resin material include epoxy resins, silicone resins, phenolic resins, polycarbonate resins, acrylic resins, TPX, polynorbornene resins, and modified resins of these and hybrid resins of two or more of these.

Because a resin material has a wettability lower than a wettability of a glass material, with the first light-transmissive member containing a resin material as the binder, creep-up of the light-guiding member 40 to the lateral surfaces of the first light-transmissive member can be reduced compared with the case where a glass material is used for the binder. That is, using a material with low wettability for the first light-transmissive member allows for reducing spreading of the light-guiding member 40 to the lateral surfaces of the second light-transmissive member 30 over the first light-transmissive member.

A phosphor that can be excited by light emitted from the light-emitting element 10 is used for the phosphor contained in the first light-transmissive member 20. For example, of specific examples of materials described below, one material can be used singly, or two or more materials can be used in combination. Specific examples of a phosphor that can be excited by a blue or ultraviolet light-emitting element include cerium-activated yttrium-aluminum-garnet phosphors (for example, $Y_3(Al,Ga)_5O_{12}:Ce$); cerium-activated lutetium-aluminum-garnet phosphors (for example, $Lu_3(Al, Ga)_5O_{12}:Ce$); europium- and/or chromium-activated nitrogen-containing calcium aluminosilicate phosphors (for example, $CaO-Al_2O_3-SiO_2:Eu$); europium-activated silicate phosphors (for example, $(Sr,Ba)_2SiO_4:Eu$); nitride phosphors such as β-SiAlON phosphors (for example, $Si_{6-z}Al_zO_zN_{8-z}:Eu$ (0<Z<4.2)), CASN phosphors (for example, $CaAlSiN_3:Eu$), and SCASN phosphors (for example, $(Sr, Ca)AlSiN_3:Eu$); manganese-activated potassium fluorosilicate phosphors (for example, $K_2SiF_6:Mn$); sulfide phosphors; and quantum-dot phosphors. A combination of such a phosphor and a blue or ultraviolet light-emitting element allows for obtaining a light-emitting device (for example, a white light-emitting device) that emits light with a desired color to be obtained. In the case of obtaining a light-emitting device that can emit white light, the type and concentration of the phosphor contained in the first light-transmissive member are adjusted so that white light is obtained. The concentration of the phosphor contained in the first light-transmissive member 20 is, for example, approximately 30 to 80% by mass.

A light-emitting device configured to emit red light can be obtained by using a blue light-emitting element for the light-emitting element 10 and a nitride based semiconductor rich in red components for the phosphor. Also, emission of amber light can be obtained by using a blue light-emitting element for the light-emitting element 10 and using a nitride phosphor rich in red components and a YAG phosphor for the phosphor. The term "amber" refers to a chromaticity range including the long-wavelength range of yellow and the short-wavelength range of yellowish red according to JIS Z 8110, in other words, a chromaticity range between the yellow range and the short-wavelength range of yellow red according to JIS Z 9101, which defines safety colors. For example, the chromaticity range of amber refers to a range of a dominant wavelength of 580 nm to 600 nm. Many of phosphors adapted to emit amber light have low light conversion efficiency, and the concentration of the phosphor is therefore preferably increased to obtain a desired color tone. In the case where a light-emitting device are configured to emit red or amber light, the concentration of the phosphor contained in the first light-transmissive member is, for example, approximately 60 to 80% by mass.

A light-emitting substance called nanocrystals or quantum dots may be used for the phosphor. Examples of such a material include semiconductor materials such as group II-VI, group III-V, or group IV-VI semiconductors, specifically nano-sized highly dispersible particles such as CdSe, core-shell $CdS_xSe_{1-x}/ZnS$, GaP, or InAs. Such a phosphor has a grain diameter of, for example, approximately 1 nm to 100 nm, preferably approximately 1 nm to 20 nm. Using such a phosphor allows for reducing internal scattering and reducing scattering of light that has undergone color conversion, so that light transmittance can be further improved.

The first light-transmissive member 20 can contain a light-diffusing material in addition to the phosphor.

Examples of the light-diffusing material that can be contained in the first light-transmissive member 20 include titanium oxide, barium titanate, aluminum oxide, and silicon oxide. Such a light-diffusing material may be contained in the second light-transmissive member 30 and/or the light-guiding member 40 described below.

The first light-transmissive member 20 can be formed by printing or the like on the lower surface of the second light-transmissive member described below. The first light-transmissive member 20 may be in direct contact with the lower surface of the second light-transmissive member 30, or may be bonded to the lower surface of the second light-transmissive member 30 with another member such as an adhesive. Examples of the bonding include compression, fusion bonding, sintering, bonding with use of an organic adhesive, and bonding with use of an inorganic adhesive such as low-melting-point glass. The first light-transmissive member 20 can be formed by printing, compression molding, phosphor electrodeposition, a phosphor sheet technique, or the like. In a printing, a paste containing the phosphor, a binder, and a solvent is prepared, applied to the surface of the second light-transmissive member, and dried, so that a phosphor layer is formed.

The first light-transmissive member 20 has a thickness (that is, a height from the lower surface to the upper surface thereof) of, for example, approximately 30 μm to 100 μm. The smaller the thickness of the first light-transmissive member 20 is, the more preferable in view of heat dissipation performance, but excessive reduction in thickness results in reduction in amount of the phosphor contained in the first light-transmissive member 20. Therefore, the thickness of the first light-transmissive member 20 is adjusted to be in the above-mentioned range in view of the chromaticity range of light intended to be obtained.

Second Light-Transmissive Member 30

The second light-transmissive member 30 is bonded to the upper surface of the first light-transmissive member 20, and has the perimeter of the lower surface substantially coinciding with the perimeter of the upper surface of the first light-transmissive member 20 in a plan view.

Light emitted from the light emitting element 10 and transmits through the first light-transmissive member 20 is incident on the lower surface of the second light-transmissive member 30, and light from the light-emitting element 10 is emitted to the outside through the upper surface of the second light-transmissive member 30, which serves as the light-extracting surface of the light-emitting device 100. That is, light of mixed color of light emitted from the light-emitting element 10 and light having a wavelength converted from at least a part of the light emitted from the light-emitting element 10 by the phosphor, the light of mixed color being emitted from the upper surface of the first light-transmissive member 20, propagates through the second light-transmissive member 30 and is emitted to the outside from the upper surface of the second light-transmissive member 30.

As described above, the lower surface of the second light-transmissive member 30 is bonded to the upper surface of the first light-transmissive member 20. For example, a plate-shaped body made of a glass material or a resin material can be used for the second light-transmissive member 30. Among these materials, a glass material is preferably used for the second light-transmissive member 30. The glass can be selected from, for example, borosilicate glass and quartz glass. The upper surface of the second light-transmissive member 30 serves as the light-emitting surface of the light-emitting device 100 and constitutes the outer surface of the light-emitting device 100, so that using a glass material for the first light-transmissive member 20 allows for reducing deterioration of the emission surface even in the case where the light-emitting device 100 has a high luminance with a narrow light-emitting surface. Because surface tackiness of a glass material is lower than surface tackiness of the resin material, with the second light-transmissive member made of a glass material for constituting the light-emitting surface of the light-emitting device, deposition of dust on the light-emitting surface can be reduced, and sticking of the light-emitting surface to carrier tape used for carrying and storing the light-emitting device can be reduced. In the present embodiment, the first light-transmissive member 20 is a resin layer containing the phosphor, and the second light-transmissive member 30 is a glass plate serving as a member for supporting the first light-transmissive member 20.

The second light-transmissive member 30 preferably has the same size as the first light-transmissive member 20 in a plan view. This structure allows the light-emitting device 100 to have a narrow light-emitting surface and high front luminance in the case where the upper surface of the second light-transmissive member 30 serves as the light-emitting surface of the light-emitting device 100. In the present embodiment, the second light-transmissive member 30 has the perimeter of the lower surface substantially coinciding with the perimeter of the upper surface of the first light-transmissive member 20 in a plan view of the light-emitting device 100, and the first light-transmissive member 20 and the second light-transmissive member 30 are integrally formed to have a substantially rectangular-parallelepiped shape.

The second light-transmissive member has a thickness (that is, a height between the lower surface and the upper surface) that is, for example, equal to or larger than a thickness of the first light-transmissive member. With the thickness of the second light-transmissive member equal to or larger than the thickness of the first light-transmissive member, the light-guiding member 40 that bonds the light-emitting element 10 to the first light-transmissive member 20 can be prevented from spreading over the entire lateral surfaces of the second light-transmissive member 30 in the case where the light-guiding member 40 wet-spreads to the lateral surfaces of the second light-transmissive member 30 over the first light-transmissive member.

Light-Guiding Member 40

The light-guiding member 40 covers the upper surface of the light-emitting element 10 and the lower and lateral surfaces of the first light-transmissive member 20 except for the upper surface and at least a part of each of the lateral surfaces continuous with the upper surface of the second light-transmissive member 30.

The light-guiding member 40 bonds the first light-transmissive member 20 to the light-emitting element 10 and guides light emitted from the light-emitting element 10 to the first light-transmissive member 20 that has the lower surface smaller in area than the upper surface of the light-emitting element 10. That is, the light emitted from the light-emitting element 10 is narrowed down during transmitting through the light-guiding member 40, and then enters the first light-transmissive member 20.

The light-guiding member 40 is disposed between the upper surface of the light-emitting element 10 and the lower surface of the first light-transmissive member 20 to cover a portion of the upper surface of the light-emitting element 10 at an outer side of the first light-transmissive member 20 in a plan view, and the lateral surfaces of the first light-transmissive member 20.

The light-guiding member 40 covering the lateral surfaces of the first light-transmissive member 20 preferably has inclined surfaces broadening from the upper surface of the first light-transmissive member 20 toward the lower surface of the first light-transmissive member 20. That is, a portion of the light-guiding member 40 covering the lateral surfaces of the first light-transmissive member 20 preferably has a width varies according to the position in a height direction of the lateral surfaces of the first light-transmissive member 20. More specifically, a width of the light-guiding member 40 in a sectional view (i.e., a width as measured in a direction normal to the lateral surface of the first light-transmissive member 20) is preferably decreased toward the upper side. The inclined surfaces may be flat surfaces, but are preferably curved surfaces. In addition, the curved surfaces are preferably in contact with both of a portion of the upper surface of the light-emitting element 10 and the lateral surfaces of the first light-transmissive member 20, and are more preferably concave or convex toward a light-reflective member 60 side. With such a shape of the light-guiding member 40, in combination with the light-reflective member 60 described below, the outer surfaces of the light-guiding member 40 can be appropriate reflection surfaces to reflect light emitted from the light-emitting element 10 and guide reflected light to the first light-transmissive member.

It is preferable that the light-guiding member 40 continuously cover the lateral surfaces of the first light-transmissive member 20 along the outer periphery of the first light-transmissive member 20. With this structure, light emitted from the light-emitting element 10 can be easily incident on the lateral surfaces of the first light-transmissive member 20 through the light-guiding member 40.

The light-guiding member 40 is preferably made of a resin material because resin materials are easy to handle and process. For the resin material, a resin member made of a resin containing one or more of a silicone resin, a modified silicone resin, an epoxy resin, a modified epoxy resin, an acrylic resins, and a fluorocarbon resin or a hybrid resin of two or more of these resins can be used. In this case, it is preferable that a resin material of the same type (more preferably the same resin material) is used for the light-guiding member 40 and the first light-transmissive member 20. For example, in the case where the first light-transmissive member 20 is a phosphor layer containing a silicone resin as the binder, a silicone resin is preferably used also for the light-guiding member 40. With the light-guiding member 40 for which a silicone resin is used, a difference between a refractive index of the first light-transmissive member 20 and a refractive index of the light-guiding member 40 can be reduced, and thus light entering the first light-transmissive member 20 from the light-guiding member 40 can be increased.

The above-described resin member may contain various fillers to adjust its viscosity. The light-guiding member 40 may further contain the phosphor as described above.

The light-guiding member 40 can be formed by a known technique such as printing, spraying, molding, or potting. Among these methods, a potting technique is preferably employed. Using a potting technique allows for easily forming the light-guiding member 40 having curved surfaces that are concave or convex toward the light-reflective member 60 side described below.

The light-guiding member 40 may extend beyond the lateral surfaces of the first light-transmissive member 20 to cover part of the lateral surfaces of the second light-transmissive member 30. In the case where the light-guiding member 40 covers a portion of each of the lateral surfaces of the second light-transmissive member 30, it is preferable that at least an upper region of the lateral surfaces of the second light-transmissive member 30 be exposed from the light-guiding member 40. For example, it is preferable that at least the upper quarter or greater, preferably the upper half or greater of the lateral surfaces of the second light-transmissive member 30 in a height thereof be exposed from the light-guiding member 40. More specifically, at least a portion of each of the lateral surfaces of the second light-transmissive member 30 distant from the upper surface of the second light-transmissive member 30 at preferably 10 µm or more, more preferably 50 µm or more, is exposed from the light-guiding member 40. In the case where the light-guiding member 40 extends to the lateral surfaces of the second light-transmissive member 30, the portion of the light-guiding member 40 covering a portion of each of the lateral surfaces of the second light-transmissive member 30 preferably has a thickness of 10 µm or less. In the case where the light-guiding member 40 covers the lateral surfaces of the second light-transmissive member 30, a portion of light emitted from the light-emitting element directly enters the second light-transmissive member 30 without passing through the first light-transmissive member 20. If a contact area between the light-guiding member 40 and the second light-transmissive member 30 is increased, light that directly enters the second light-transmissive member 30 through the light-guiding member 40 without passing through the first light-transmissive member 20 is increased. Increase in the amount of light that directly enters the second light-transmissive member through the light-guiding member 40 may lead to unevenness in emission color. With the thickness of the portion of the light-guiding member covering the second light-transmissive member 30 of 10 µm or less, light that directly enters the second light-transmissive member 30 through the light-guiding member 40 without passing through the first light-transmissive member 20 can be reduced.

It is more preferable that the entire lateral surfaces of the second light-transmissive member 30 are exposed from the light-guiding member 40. This structure allows only light that has passed through the first light-transmissive member 20 to be emitted from the light-emitting surface of the light-emitting device 100, so that unevenness in emission color can be further reduced. In the present specification, the expression "the entire lateral surfaces are exposed from the light-guiding member" includes the case where an upper end portion of the light-guiding member 40 substantially coincides with a lower end portion of each of the lateral surfaces of the second light-transmissive member 30.

In particular, in the case where a desired emission color of the light-emitting device can be constituted by only light that has been wavelength-converted by the phosphor, such as in the case where a light-emitting device is configured to emit light in the red wavelength range upon excitation by blue light emitted from a blue light-emitting element used as the light-emitting element 10, at least the upper half of the lateral surfaces of the second light-transmissive member 30 is preferably exposed from the light-guiding member 40. With this arrangement, radiation of light emitted from the light-emitting element 10 directly to the outside can be reduced, so that color shift of the light-emitting device can be reduced.

To reduce the area and thickness of the portion of the light-guiding member 40 covering the second light-transmissive member 30, the first light-transmissive member 20 preferably has a great thickness. If the first light-transmissive member 20 has a small thickness, the light-guiding member 40 easily spreads to the lateral surfaces of the second light-transmissive member 30 over the lateral surfaces of the first light-transmissive member 20. However, the first light-transmissive member containing the phosphor preferably has a small thickness in view of heat dissipation performance. In view of these, for example, a thickness of the first light-transmissive member 20, as measured between the upper surface and the lower surface of the first light-transmissive member 20, is at least larger than a width of the portion of the light-emitting element 10 exposed from the first light-transmissive member 20, as measured in the plan view between the perimeter of the light emitting element 10 and the perimeter of the first light-transmissive member 20. That is, as shown in FIG. 1C, a thickness D of the first light-transmissive member 20 is preferably larger than a width L of the portion of the light-emitting element exposed from the first light-transmissive member in a cross-sectional view of the light-emitting device 100. This structure allows for reducing spreading of the light-guiding member 40 to the second light-transmissive member 30.

With the perimeter of the lower surface of the first light-transmissive member 20 being disposed inwardly of the perimeter of the upper surface of the light-emitting element 10, the light-guiding member 40 bonding the upper surface of the light-emitting element 10 to the lower surface of the first light-transmissive member 20 spreads over the upper surface of the light-emitting element 10 and creeps up and spreads on the lateral surfaces of the first light-transmissive member 20. In the case where the light-guiding member 40 is formed by potting, an uncured resin material to constitute the light-guiding member exhibits a property of minimizing its surface area thereof (so-called surface tension). Accordingly, the light-guiding member 40 having the above-mentioned concave or convex curved surface can be formed.

In a cross-sectional view of the light emitting device 100, the light-guiding member 40 has the minimum surface area in the case where a width of the portion of the light-emitting element exposed from the first light-transmissive member 20 and covered with the light-guiding member 40 is substantially equal to a thickness of the portion of the first light-transmissive member 20 covered with the light-guiding member 40. It is preferable that the entire upper surface of the light-emitting element 10 be covered with the light-guiding member 40 in view of light extraction. That is, with a thickness D of the first light-transmissive member 20 larger than a width L of the portion of the light-emitting element exposed from the first light-transmissive member in a cross-sectional view of the light-emitting device 100, an amount of the light-guiding member 40 to be potted can be easily adjusted so that spreading of the light-guiding member 40 can be kept within the lateral surfaces of the first light-transmissive member 20 while covering the portion of the upper surface of the light-emitting element 10 exposed from the first light-transmissive member 20.

Light-Reflective Member 60

The light-emitting device 100 includes the light-reflective member 60 covering the lateral surfaces of the second light-transmissive member 30, which are exposed from the light-guiding member 40, and the lateral surfaces of the light-guiding member 40 except for the upper surface of the second light-transmissive member 30. The light-reflective member 60 directly covers the lateral surfaces of the second light-transmissive member 30, which are exposed from the light-guiding member 40. With the light-reflective member 60 directly covering the lateral surfaces of the second light-transmissive member 30 without the light-guiding member 40, the light-emitting device 100 can have clear difference in luminance between the upper surface of the second light-transmissive member 30 that serves as the light-emitting part of the light-emitting device 100, and a non-light-emitting part (that is, the upper surface of the light-reflective member 60 surrounding the second light-transmissive member 30) surrounding the light-emitting portion, so that the light-emitting device 100 with small unevenness in emission color can be obtained.

The light-reflective member 60 is made of a material that can reflect light emitted from the light-emitting element 10. More specifically, the member can be made of a resin member as used for the light-guiding member 40 described above and a light-reflective substance contained in the resin member. Examples of the light-reflective substance include titanium oxide, silicon oxide, zirconium oxide, yttrium oxide, yttria-stabilized zirconia, potassium titanate, alumina, aluminum nitride, boron nitride, and mullite. The concentration of the light-reflective substance contained in the light-reflective member 60 is, for example, approximately 9 to 60% by weight.

The light-reflective member 60 can be formed by, for example, injection molding, potting, printing, molding, or compression molding.

The light-emitting device 100 may include a protective element such as a Zener diode. In the case where the light-emitting device 100 includes a protective element, embedding the protective element in the light-reflective member 60 allows for preventing reduction in light extraction due to absorption of light by the protective element and shielding of light from the light-emitting element 10 by the protective element.

As described above, the light-reflective member 60 covers the lateral surfaces of the second light-transmissive member 30, which are continuous with the upper surface of the second light-transmissive member 30, except for the upper surface of the second light-transmissive member 30, which has an area smaller than an area of the light-emitting element in a plan view, so that the upper surface of the second light-transmissive member 30 serves as the light-emitting surface of the light-emitting device 100. This structure allows the light-emitting device 100 to have a narrow light-emitting surface and high front luminance. Light-emitting devices with high front luminance are particularly suitable for lights for vehicles, such as headlights.

Substrate 50

In the light-emitting device 100, the light-emitting element 10 is disposed on the substrate 50 as shown in FIG. 1A and FIG. 1B.

Examples of the material of the substrate 50 include an insulating member such as glass epoxy, a resin, or a ceramic, and a metal member with an insulating member disposed thereon. Among these materials, for the material of the substrate, a ceramic, which has good heat resistance and weather resistance is preferably used. Examples of the ceramic material include alumina, aluminum nitride, and mullite. Such a ceramic material may be combined with an insulating material such as BT resins, glass epoxy, or epoxy based resins.

Conductor wirings 51 connected to the light-emitting element 10 are disposed on a surface of the substrate 50. Examples of the material of the conductor wiring 51 include metals such as copper, aluminum, gold, silver, platinum, titanium, tungsten, palladium, iron, and nickel and alloys of two or more of these metals. The outermost surface of the wiring formed on the upper surface of the substrate is preferably covered with a material having a high reflectance, such as silver and gold, in order to efficiently extract light emitted from the light-emitting element. The conductor wiring 51 can be formed by electroplating, electroless plating, vacuum evaporation, sputtering, or the like. For example, in the case where Au bumps are used to mount the light-emitting element on the substrate, with the outermost surface of the wiring made of Au, bondability between the light-emitting element and the substrate can be improved.

For such a substrate, any substrate known in the field of the present invention and used for mounting an electronic component such as a light-emitting element thereon can be used.

Second Embodiment

Figure 2A:
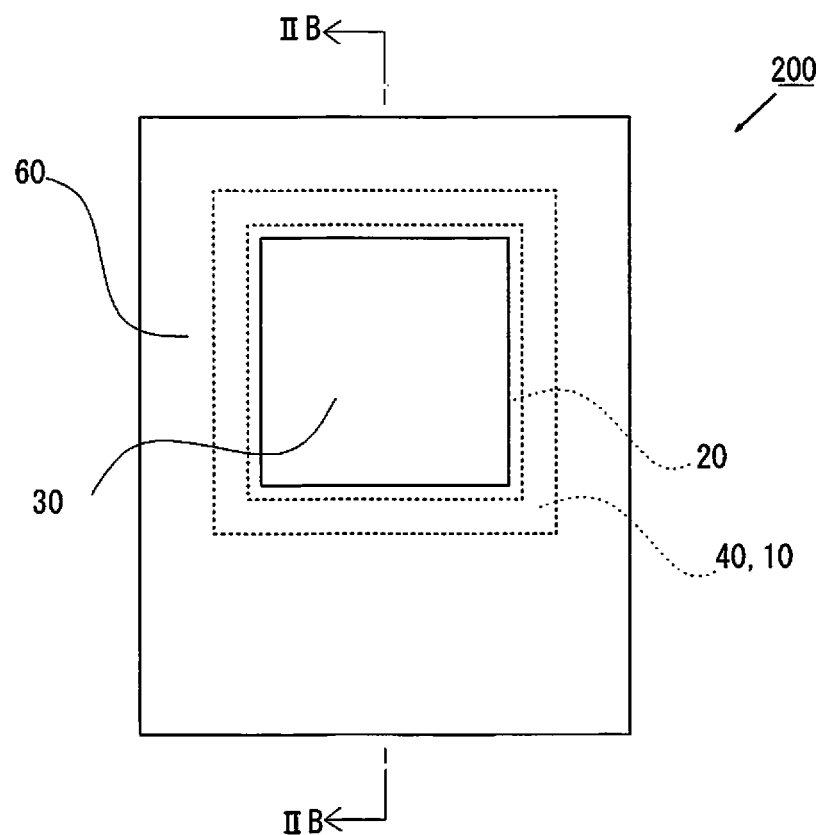
FIG. 2A is a schematic plan view of a light-emitting device according to a second embodiment of the present invention.
Figure 2B:
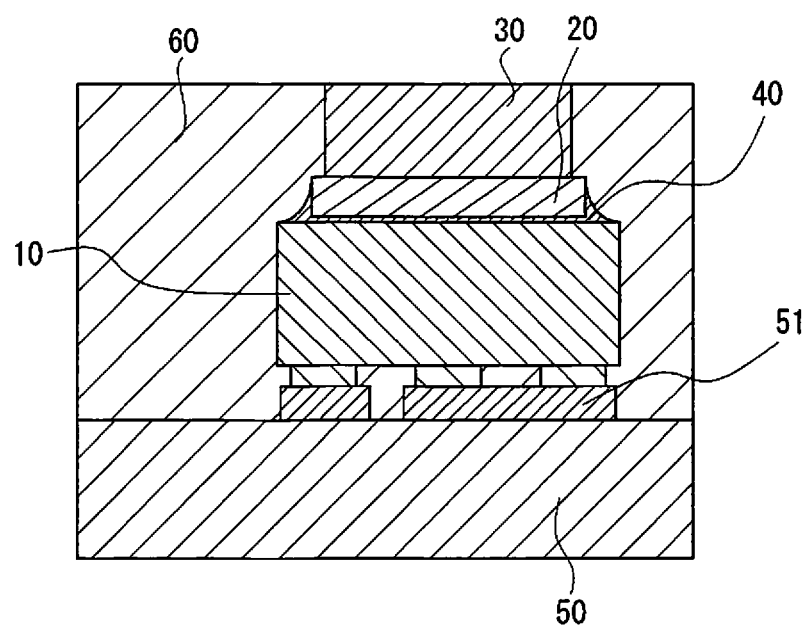
FIG. 2B is a schematic cross-sectional view taken along the line IIB-IIB in FIG. 2A.

A light-emitting device 200 according to a second embodiment of the present invention will be described. As shown in FIG. 2A and FIG. 2B, the light-emitting device according to the second embodiment includes: a light-emitting element 10 having an upper surface serving as a light-extracting surface of the light emitting element; a first light-transmissive member 20 disposed on the upper surface of the light-emitting element 10, having a lower surface with a perimeter disposed inwardly of a perimeter of the upper surface of the light-emitting element 10 in a plan view, and containing the phosphor; a second light-transmissive member 30 bonded to an upper surface of the first light-transmissive member 20 and having a lower surface with a perimeter disposed inwardly of a perimeter of an upper surface of the first light-transmissive member in the plan view; a light-guiding member 40 covering the upper surface of the light-emitting element 10 and the lower surface and lateral surfaces of the first light-transmissive member 20 while the light-guiding member 40 does not cover an upper surface of the second light-transmissive member 30 and at least a portion of each of the lateral surfaces of the second light-transmissive member 30 continuous with the upper surface of the second light-transmissive member 30; and a light-reflective member 60 covering the lateral surfaces of the light-guiding member 40 and at least the portion of each of the lateral surfaces of the second light-transmissive member 30 exposed from the light-guiding member 40, while the light-reflective member 60 does not cover the upper surface of the second light-transmissive member 30.

The light-emitting device 200 according to the second embodiment differs from the light-emitting device 100 in the first embodiment in that the perimeter of the lower surface of the second light-transmissive member 30 is disposed inwardly of the upper-surface perimeter of the first light-transmissive member 20.

Also in the light-emitting device 200 according to the second embodiment, unevenness in emission color can be reduced, so that the light-emitting device 200 having a narrower light-emitting surface and high front luminance can be obtained.

Third Embodiment

Figure 3A:
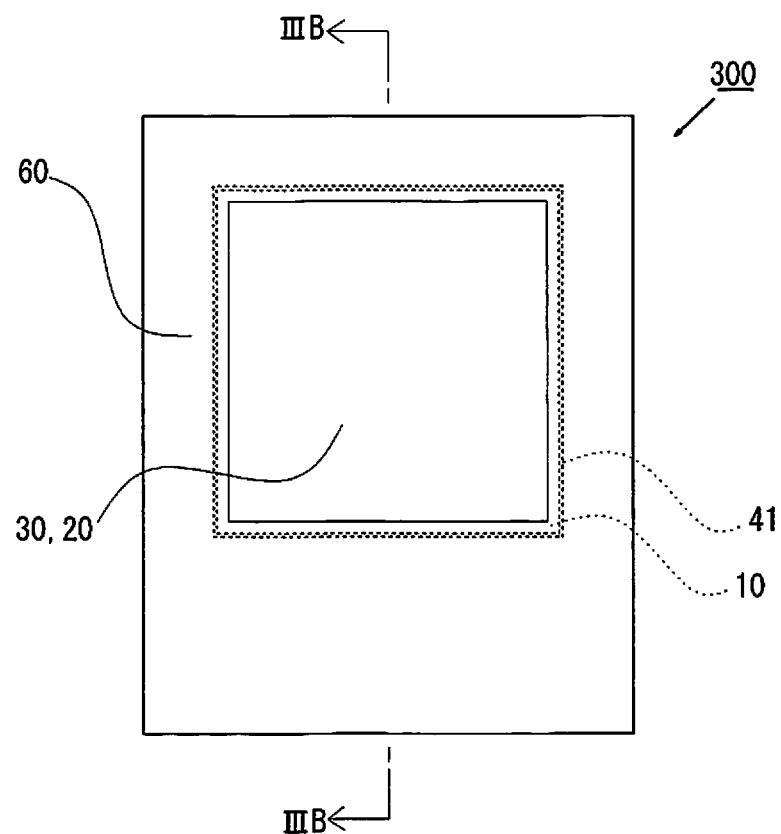
FIG. 3A is a schematic plan view of a light-emitting device according to a third embodiment of the present invention.
Figure 3B:
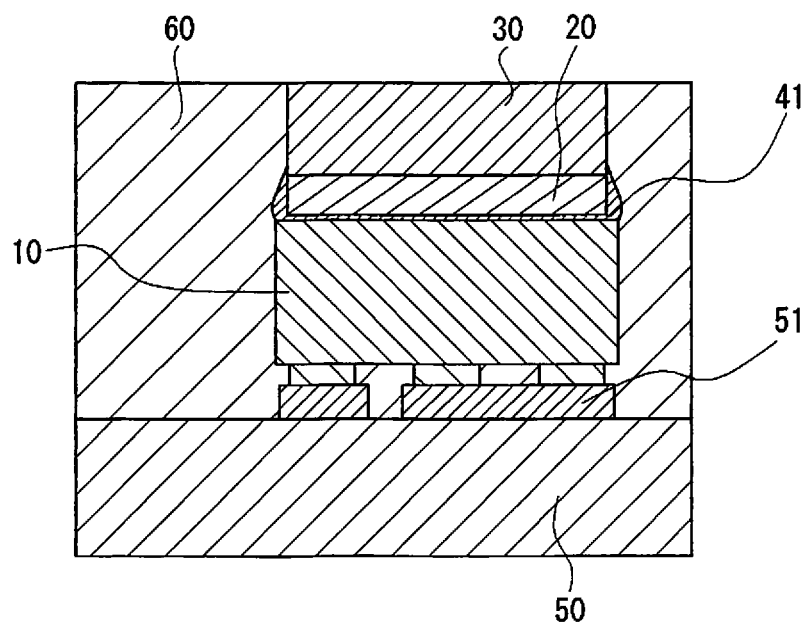
FIG. 3B is a schematic cross-sectional view taken along the line IIIB-IIIB in FIG. 3A.
Figure 3C:
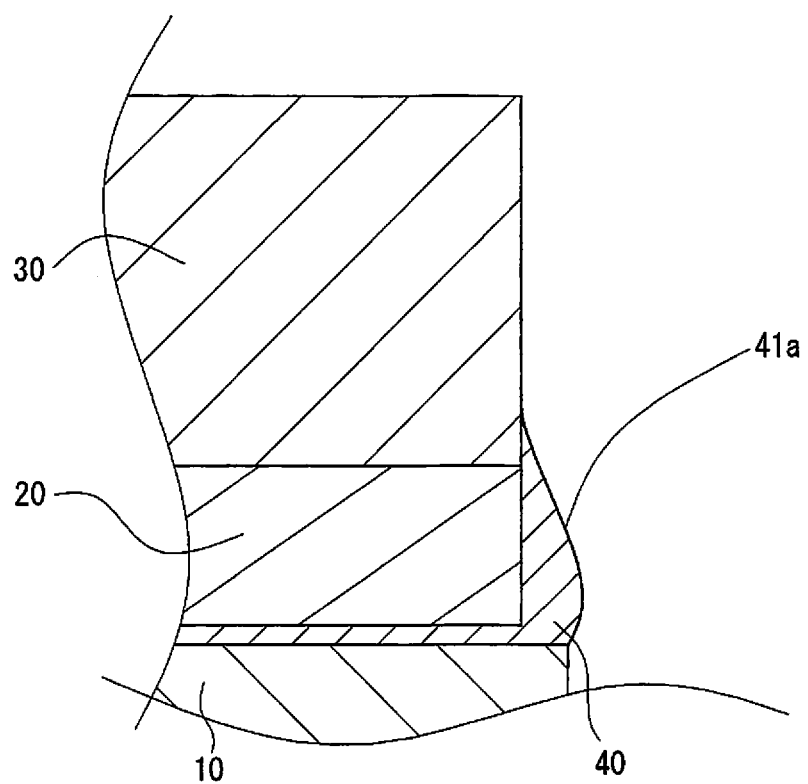
FIG. 3C is an enlarged schematic cross-sectional view of a portion of the light-emitting device according to the third embodiment in the vicinity of a lateral surface of the first light-transmissive member.

A light-emitting device 300 according to a third embodiment of the present invention will be described. As shown in FIGS. 3A-3C, the light-emitting device according to the third embodiment includes: a light-emitting element 10 having an upper surface serving as the light-extracting surface of the light emitting element; a first light-transmissive member 20 disposed on the upper surface of the light-emitting element 10, having a lower surface with a perimeter disposed inwardly of the perimeter of the upper surface of the light-emitting element 10 in a plan view, and containing a phosphor; a second light-transmissive member 30 bonded to the upper surface of the first light-transmissive member 20 and having a lower surface with a perimeter substantially coinciding with a perimeter of an upper surface of the first light-transmissive member in the plan view; a light-guiding member 41 covering the upper surface of the light-emitting element 10 and the lower surface and lateral surfaces of the first light-transmissive member 20, while the light-guiding member 41 does not cover the upper surface and at least a portion of each of the lateral surfaces continuous with the upper surface of the second light-transmissive member 30; and a light-reflective member 60 covering lateral surfaces of the light-guiding member 41 and the at least the portion of each of the lateral surfaces of the second light-transmissive member 30 exposed from the light-guiding member 41, while the light-reflective member 60 does not cover the upper surface of the second light-transmissive member 30. The light-emitting element 10 is flip-chip mounted on the substrate 50.

In the present embodiment, each of lateral surfaces 41a of the light-guiding member 41 is an inclined surface having a portion that broadens from an upper surface side of the first light-transmissive member 20 toward a lower surface side of the first light-transmissive member 20. The lateral surfaces 41a are curved surfaces that are convex toward the light-reflective member 60 side and are in contact with the lateral surfaces of the first light-transmissive member 20 and part of the upper surface or part of the lateral surfaces of the light-emitting element 10. The lateral surfaces 41a of the light-guiding member 41 may be located at an outer side of the outer periphery of the light-emitting element 10.

For example, in the case where the light-guiding member 41 is formed by potting, the light-guiding member 41 has curved surfaces that are convex outward, which are formed due to surface tension of the light-guiding member 41, at end portions (that is, corner portions adjacent to the lateral surfaces of the light-emitting element) of the upper surface of the light-emitting element 10. This structure allows for reducing spread of the light-guiding member 41 over the lateral surfaces of the light-emitting element 10 and confirming that the entire upper surface of the light-emitting element 10 is covered with the light-guiding member 41.

For example, in the case where the difference between an area of the lower surface of the first light-transmissive member 20 and an area of the upper surface of the light-emitting element 10 is small, that is, the portion of the light-emitting element exposed from the first light-transmissive member has a small width in a cross-sectional view of the light-emitting device 100, the light-guiding member 41 is likely to drip from a space between the first light-transmissive member and the light-emitting element onto the lateral surfaces of the light-emitting element. If the light-guiding member 41 reaches the substrate 50 via the lateral surfaces of the light-emitting element 10, light emitted from the light-emitting element may reach the substrate through the light-guiding member 41 and be absorbed by the substrate, so that the light extraction efficiency of the light-emitting device 300 may be decreased. In the present embodiment, the lateral surfaces 41a of the light-guiding member 41 are curved surfaces that are convex toward the light-reflective member 60 side, so that wet-spreading of the light-guiding member 41 to the lateral surfaces of the light-emitting element 10 can be reduced. The light-guiding member 41 having the curved surfaces that are convex toward the light-reflective member 60 side can be formed by adjusting the type, viscosity, and curing conditions of the resin material constituting the light-guiding member 41. The viscosity of the resin material can be adjusted by, for example, changing the amount of fillers contained in the resin material.

Also in the light-emitting device 300 of the third embodiment, unevenness in emission color can be reduced, and the light-emitting device 300 can have a narrower light-emitting surface and high front luminance.

Fourth Embodiment

Figure 4A:
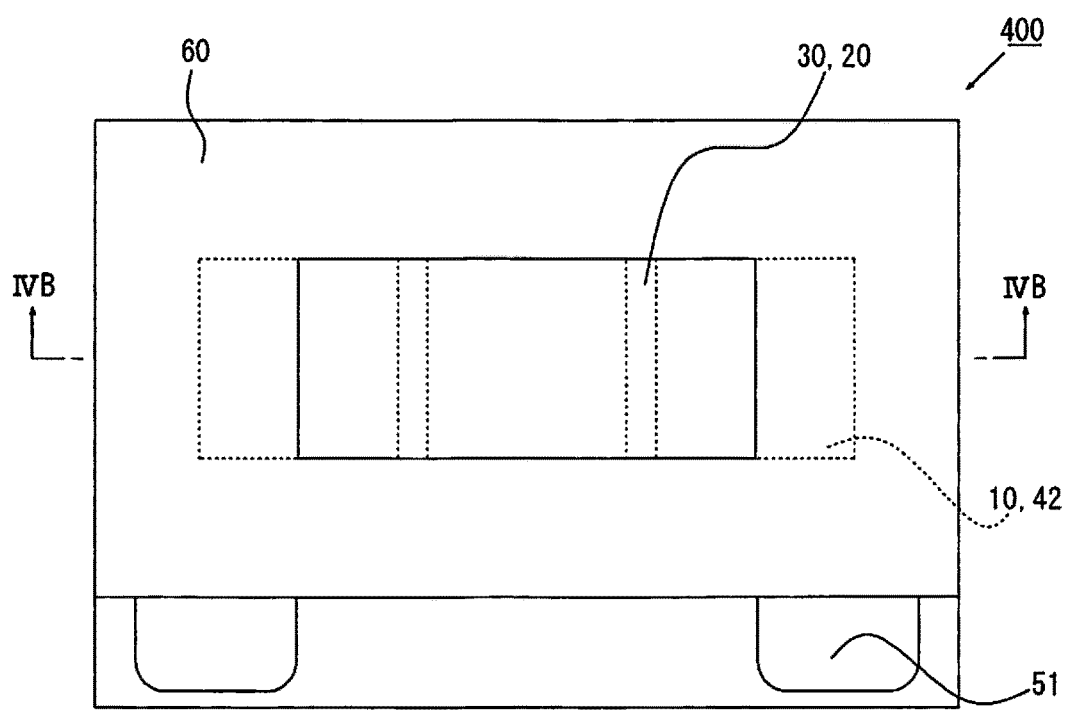
FIG. 4A is a schematic plan view of a light-emitting device according to a fourth embodiment of the present invention.
Figure 4B:
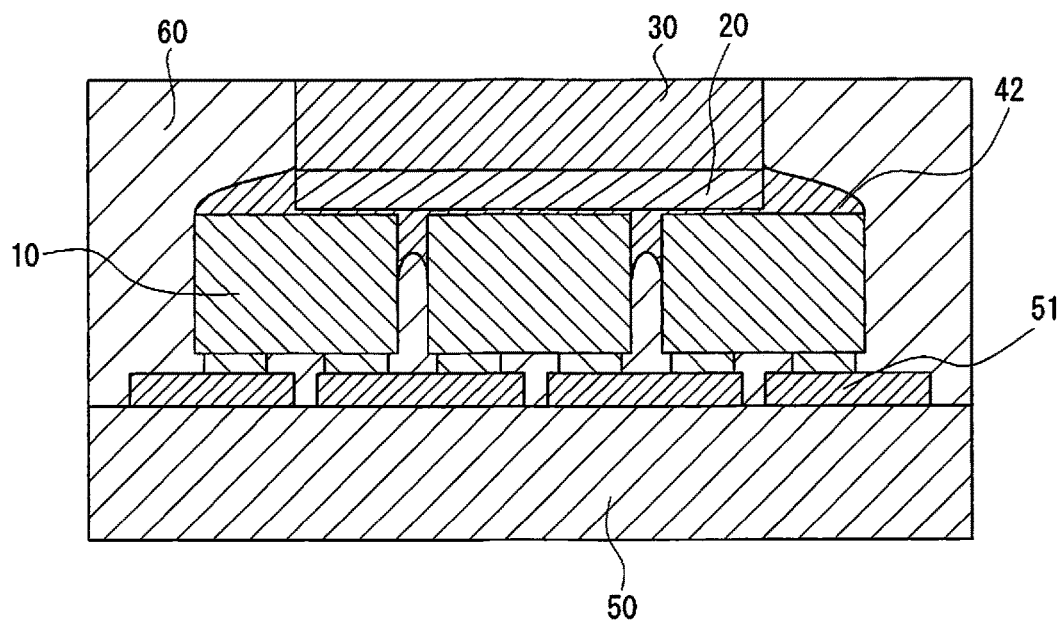
FIG. 4B is a schematic cross-sectional view taken along the line IVB-IVB in FIG. 4A.

A light-emitting device 400 according to a fourth embodiment of the present invention will be described. As shown in FIG. 4A and FIG. 4B, the light-emitting device in the fourth embodiment includes: a light emitting element unit including a plurality of light-emitting elements 10 each having an upper surface that serves as a light-extracting surface of respective one of the plurality of light emitting elements, the plurality of light-emitting elements 10 being arranged so that the light emitting element unit as a whole has a substantially rectangular shape a plan view; a first light-transmissive member 20 disposed on the upper surface of each the plurality of light-emitting elements 10, the first light-transmissive member 20 having a lower surface with a perimeter disposed inwardly of an outermost perimeter of the plurality of light-emitting elements 10 in a plan view, and containing the phosphor; a second light-transmissive member 30 bonded to an upper surface of the first light-transmissive member 20 and having a lower surface with a perimeter substantially coinciding with a perimeter of the upper surface of the first light-transmissive member in the plan view; a light-guiding member 42 covering a portion of the upper surface of each of the plurality of light-emitting elements 10 exposed from the first light-transmissive member 20, and the lower surface and lateral surfaces of the first light-transmissive member 20, while the light-guiding member 42 does not cover the upper surface and at least a portion of each of lateral surfaces of the second light-transmissive member 30, which are continuous with the upper surface of the second light-transmissive member 30; and a light-reflective member 60 covering lateral surfaces of the light-guiding member 42 and at least the portion of the lateral surfaces of the second light-transmissive member 30 exposed from the light-guiding member 42, while the light-reflective member 60 does not cover the upper surface of the second light-transmissive member 30. The light-emitting elements 10 are flip-chip mounted on the substrate 50.

In the light-emitting device 400 according to the fourth embodiment, a single first light-transmissive member is bonded to the upper surfaces of a plurality of light-emitting elements 10. The light-emitting elements 10 are aligned such that the lateral surfaces thereof faces each other. In the present embodiment, the light-emitting elements 10 constituting the light emitting element unit are arranged on the substrate 50 in a substantially rectangular shape as a whole in a plan view. The first light-transmissive member 20 and the second light-transmissive member 30 have substantially the same substantially rectangular shape in a plan view. In a plan view, at least a portion of the outer perimeter of the first light-transmissive member 20 is located at an inner side of the outermost perimeter of the plurality of light-emitting elements 10 constituting the light emitting element unit.

The light-guiding member 42 covers a portion of the upper surface of each of the light-emitting elements 10 exposed from the first light-transmissive member 20, and the lateral surfaces of the first light-transmissive member 20. The light-guiding member 42 has lateral surfaces each having a width that increases from an upper side toward a lower side of the first light-transmissive member 20. Further, in the present embodiment, the light-guiding member 42 covers at least a portion of each of lateral surfaces of adjacent light-emitting elements of the light emitting elements 10 facing each other.

In the present embodiment, the light-guiding member 42 covering the portion of the upper surface of each of the light-emitting elements 10 exposed from the first light-transmissive member 20 preferably has lateral surfaces that are projected toward a light-reflective member 60 side. As shown in FIG. 4A and FIG. 4B, the light-guiding member 42 preferably has curved surfaces that are convex toward the light-reflective member 60 side even in the case where a large proportion of the area of the upper surfaces of the light-emitting elements 10 is exposed from the first light-transmissive member 20. Adjustment of the viscosity and amount of an uncured resin material that constitutes the light-guiding member 42 so that convex surfaces are formed due to surface tension at the outer periphery of the upper surfaces of the light-emitting elements 10 allows for reducing spread of the light-guiding member 42 to the lateral surfaces of the light-emitting elements 10 and allows the light-guiding member 42 to cover the entire upper surface of each of the light-emitting elements 10.

Also, the light-guiding member 42 preferably extends between adjacent light-emitting elements 10 and covers at least a portion of each of lateral surfaces of the adjacent light-emitting elements 10 facing each other. With the light-guiding member 42 arranged between adjacent light-emitting elements 10, unevenness in color and luminance between the adjacent light-emitting elements can be reduced. In this arrangement, the light-guiding member 42 covering lateral surfaces between light-emitting elements facing each other preferably has lateral surfaces that are recessed outward (toward the light-reflective member 60 side in the case where the light-reflective member 60 is disposed). With such a shape of the light-guiding member 42, in combination with the light-reflective member 60, the outer surfaces of the light-guiding member 42 can be appropriate reflection surfaces to reflect light emitted from the lateral surfaces of the light-emitting elements 10 and guide reflected light to the first light-transmissive member 20.

In the case where the light-emitting device 400 includes a plurality of light-emitting elements 10 as described above, a portion of the light-guiding member 42 at an upper surface side of the light-emitting elements 10 is preferably projected toward the light-reflective member (that is, in a region above the light-emitting elements 10 at lateral sides of the first light-transmissive member 20) and a portion of the light-guiding member 42 between adjacent light-emitting elements 10 is preferably recessed away from the light-reflective member side (that is, in a region at lateral sides of each of the light-emitting elements 10 below the first light-transmissive member 20). The light-guiding member 42 can be formed by, for example, a potting technique. The light-guiding member 42 can be formed by disposing resin materials that constitute the light-guiding member 42 respectively on the upper surface of respective one of the light-emitting elements 10 using a potting technique and then pressing the resin material with the first and second light-transmissive members. In this case, with resin materials having varied viscosities disposed on the upper surface of each of the light-emitting elements, the light-guiding member 42 having the above-mentioned shape can be obtained. More specifically, the viscosity of the resin material disposed on each of outermost light-emitting elements of the light-emitting elements 10 is adjusted so that convex surfaces are formed at the outer periphery of an upper surface of each of the outermost light-emitting elements, and the viscosity of the resin material disposed on a central light-emitting element of the light-emitting elements 10 is adjusted to be lower than the viscosity of the resin material disposed on each of the outermost light-emitting elements so that the resin material spreads to the lateral surfaces of the light-emitting elements 10 without spreading to the substrate. Such an adjustment allows the light-guiding member 42 to be recessed away from the light-reflective member 60 side due to surface tension. The viscosity of each of the resin materials is preferably adjusted by changing the amount of fillers to be contained in the resin material. Even in the case where substantially the same material is used for the resin materials, the viscosity of some of the resin materials can be higher than that of the other of the resin materials by increasing the content of fillers. With the resin materials for which substantially the same resin material is used, the resin materials can be cured under similar conditions, so that a single light-guiding member 42 without interfaces between the resin materials having different viscosities can be formed. Further, in this case, for the fillers added in order to adjust the viscosity of some of the resin materials, a substance having a refractive index similar to a refractive index of the resin material can be used. With such a substance, decrease in the light extraction efficiency due to addition of the filler to the light-guiding member 42 can be prevented. Examples of a combination of a material of the resin material and a material of the filler includes a silicone resin and silica, respectively.

Also in the light-emitting device 400 according to the fourth embodiment, unevenness in emission color can be reduced, and the light-emitting device 400 having a narrower light-emitting surface and high front luminance can be obtained.

The light-emitting devices according to the present invention can be applied to various light sources such as light sources for lighting apparatuses, various indicators, display devices, backlights for liquid crystal display devices, traffic lights, vehicle components, and channel letters for signage, in addition to light sources for vehicles.

What is claimed is:

1. A light-emitting device comprising:
   a light-emitting element having an upper surface serving as a light-extracting surface of the light emitting element;
   a first light-transmissive member containing a phosphor and disposed on the upper surface of the light-emitting element, the first light-transmissive member having an upper surface and a lower surface, at least a portion of a perimeter of the lower surface of the first light-transmissive member being disposed inwardly of a perimeter of the upper surface of the light-emitting element in a plan view;
   a second light-transmissive member having an upper surface and a lower surface with the lower surface of the second light-transmissive member being bonded to the upper surface of the first light-transmissive member, a perimeter of the lower surface of the second light-transmissive member substantially coinciding with or disposed inwardly of a perimeter of the upper surface of the first light-transmissive member in the plan view;
   a light-guiding member covering the upper surface of the light-emitting element and the lower surface and lateral surfaces of the first light-transmissive member, the light-guiding member not covering an upper surface of the second light-transmissive member and at least a portion of each of lateral surfaces of the second light-transmissive member continuous with the upper surface of the second light-transmissive member, the light-guiding member containing a resin material; and
   a light-reflective member covering lateral surfaces of the light-guiding member and at least the portion of each of the lateral surfaces of the second light-transmissive member exposed from the light-guiding member, the light-reflective member not covering the upper surface of the second light-transmissive member.

2. The light-emitting device according to claim 1, wherein the first light-transmissive member contains a resin material.

3. The light-emitting device according to claim 1, wherein the second light-transmissive member contains a glass material.

4. The light-emitting device according to claim 1, wherein a thickness of the first light-transmissive member, as measured between the upper surface and the lower surface of the first light-transmissive member, is larger than a width of a portion of the light-emitting element exposed from the first light-transmissive member, as measured in the plan view between the perimeter of the light emitting element and the perimeter of the first light-transmissive member.

5. The light-emitting device according to claim 1, wherein each of the lateral surfaces of the light-guiding member is inclined with respect to a corresponding one of the lateral surfaces of the first light-transmissive member such that a width of the light-guiding member, as measured in a direction normal to the corresponding one of the lateral surfaces of the first light-transmissive member, increases from an upper surface side toward a lower surface side of the first light-transmissive member.

6. The light-emitting device according to claim 5, wherein each of the lateral surfaces of the light-guiding member is a curved surface.

7. The light-emitting device according to claim 1, wherein the light-guiding member has curved surfaces recessed away from the light-reflective member.

8. The light-emitting device according to claim 1, wherein the light-guiding member has curved surfaces projecting toward the light-reflective member.

9. The light-emitting device according to claim 1, wherein the first light-transmissive member and the light-guiding member contain the same resin material.

10. The light-emitting device according to claim 1, wherein
    the light-guiding member contains a filler.

11. The light-emitting device according to claim 10, wherein
    the light-guiding member covers at least a portion of each of lateral surfaces of adjacent ones of the plurality of light-emitting elements facing each other.

12. A light-emitting device comprising:
    a light emitting element unit including a plurality of light-emitting elements each having an upper surface serving as a light-extracting surface, the plurality of light-emitting elements being arranged so that the light emitting element unit as a whole has a substantially rectangular shape in a plan view;
    a first light-transmissive member containing a phosphor and disposed on the upper surface of each of the plurality of light-emitting elements, the first light-transmissive member having an upper surface and a lower surface, at least a portion of a perimeter of the lower surface of the first light-transmissive member being disposed inwardly of an outermost perimeter of the light emitting element unit in a plan view and;
a second light-transmissive member having an upper surface and a lower surface with the lower surface of the second light-transmissive member being bonded to the upper surface of the first light-transmissive member, a perimeter of the lower surface of the second light-transmissive member substantially coinciding with or disposed inwardly of a perimeter of the upper surface of the first light-transmissive member in the plan view;
a light-guiding member covering a portion of the upper surface of each of the plurality of light-emitting elements exposed from the first light-transmissive member, and the lower surface and lateral surfaces of the first light-transmissive member, the light-guiding member not covering the upper surface of the second light-transmissive member and at least a portion of each of lateral surfaces of the second light-transmissive member continuous with the upper surface of the second light-transmissive member, the light-guiding member containing a resin material; and
a light-reflective member covering lateral surfaces of the light-guiding member and at least the portion of each of the lateral surfaces of the second light-transmissive member exposed from the light-guiding member, the light-reflective member not covering the upper surface of the second light-transmissive member.

13. The light-emitting device according to claim 12, wherein
the first light-transmissive member contains a resin material.

14. The light-emitting device according to claim 12, wherein
the second light-transmissive member contains a glass material.

15. The light-emitting device according to claim 12, wherein
the light-guiding member has a surface inclined with respect to a corresponding one of the lateral surfaces of the first light-transmissive member such that a width of the light-guiding member, as measured in a direction normal to the corresponding one of the lateral surfaces of the first light-transmissive member, increases from an upper surface side toward a lower surface side of the first light-transmissive member.

16. The light-emitting device according to claim 12, wherein
the light-guiding member contains a filler.

17. The light-emitting device according to claim 12, wherein
the first light-transmissive member and the light-guiding member contain the same resin material.

* * * * *